(12) United States Patent
Colpani et al.

(10) Patent No.: US 9,960,131 B2
(45) Date of Patent: May 1, 2018

(54) METHOD FOR THERMO-MECHANICAL STRESS REDUCTION IN SEMICONDUCTOR DEVICES AND CORRESPONDING DEVICE

(71) Applicant: STMICROELECTRONICS S.R.L., Agrate Brianza (IT)

(72) Inventors: Paolo Colpani, Agrate Brianza (IT); Antonella Milani, Cusano Milanino (IT); Lucrezia Guarino, Milan (IT); Andrea Paleari, Brugherio (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days. days.

(21) Appl. No.: 15/251,355

(22) Filed: Aug. 30, 2016

(65) Prior Publication Data
US 2017/0221841 A1    Aug. 3, 2017

(30) Foreign Application Priority Data
Feb. 1, 2016    (IT) .......................... 102016000010034

(51) Int. Cl.
*H01L 21/44*    (2006.01)
*H01L 23/00*    (2006.01)

(52) U.S. Cl.
CPC ............. *H01L 24/05* (2013.01); *H01L 24/03* (2013.01); *H01L 2224/02205* (2013.01); *H01L 2224/02215* (2013.01); *H01L 2224/04042* (2013.01); *H01L 2224/05018* (2013.01); *H01L 2224/05025* (2013.01); *H01L 2224/05082* (2013.01); *H01L 2224/05147* (2013.01); *H01L 2224/05562* (2013.01); *H01L 2224/05655* (2013.01); *H01L 2924/04642* (2013.01); *H01L 2924/05042* (2013.01); *H01L 2924/351* (2013.01)

(58) Field of Classification Search
CPC ..................... H01L 24/05; H01L 24/03; H01L 2224/02205
USPC .................................. 257/751, 774; 438/613
See application file for complete search history.

(56) References Cited

U.S. PATENT DOCUMENTS 4,949,162 A * 8/1990 Tamaki ............... H01L 23/5222
                                                    257/499
5,117,280 A * 5/1992 Adachi ............... H01L 23/5226
                                                    257/669
(Continued)

OTHER PUBLICATIONS

Yee, P. K. et al., "Palladium-Copper Inter-diffusion during Copper Activation for Electroless Nickel Plating Process on Copper Power Metal," 2014 IEEE 21$^{st}$ International Symposium on the Physical and Failure Analysis of Integrated Circuits (IPFA), pp. 219-222, Jun. 30-Jul. 4, 2014.

*Primary Examiner* — Nitin Parekh
(74) *Attorney, Agent, or Firm* — Seed IP Law Group LLP

(57) ABSTRACT

In one embodiment, a semiconductor device includes one or more metallizations, such as, e.g., Cu-RDL metallizations, provided on a passivation layer over a dielectric layer. A via is provided through the passivation layer and the dielectric layer in the vicinity of the corners of the metallization. The via may be a "dummy" via without electrical connections to an active device and may be provided at a distance between approximately 1 micron ($10^{-6}$ m.) and approximately 10 micron ($10^{-5}$ m.) from each one of said converging sides landing on an underlying metal layer.

16 Claims, 1 Drawing Sheet

(56) References Cited

U.S. PATENT DOCUMENTS

| | | | |
|---|---|---|---|
| 5,763,936 A * | 6/1998 | Yamaha | H01L 23/3171 |
| | | | 257/620 |
| 5,885,857 A * | 3/1999 | Yamaha | H01L 23/3171 |
| | | | 257/E23.132 |
| 6,093,631 A | 7/2000 | Jaso et al. | |
| 6,118,180 A * | 9/2000 | Loo | H01L 24/02 |
| | | | 228/180.22 |
| 6,413,863 B1 | 7/2002 | Liu et al. | |
| 6,417,089 B1 * | 7/2002 | Kim | H01L 24/11 |
| | | | 257/E21.508 |
| 6,570,243 B1 | 5/2003 | Hagihara | |
| 6,833,323 B2 | 12/2004 | Yui et al. | |
| 2007/0020906 A1 | 1/2007 | Chiu et al. | |
| 2009/0127710 A1 * | 5/2009 | Daubenspeck | H01L 23/3192 |
| | | | 257/737 |
| 2009/0302473 A1 | 12/2009 | Shibata et al. | |
| 2011/0095418 A1 | 4/2011 | Lim et al. | |
| 2011/0149137 A1 | 6/2011 | Koike | |
| 2013/0099383 A1 | 4/2013 | Meyer-Berg et al. | |
| 2014/0312491 A1 * | 10/2014 | Jin | H01L 23/481 |
| | | | 257/737 |
| 2015/0364430 A1 | 12/2015 | Lin | |

* cited by examiner

METHOD FOR THERMO-MECHANICAL STRESS REDUCTION IN SEMICONDUCTOR DEVICES AND CORRESPONDING DEVICE

BACKGROUND

Technical Field

The description relates to thermo-mechanical stress reduction in semiconductor devices.

One or more embodiments may apply, e.g., to integrated circuits, e.g., for automotive and consumer products.

Description of the Related Art

Various types of integrated circuits (ICs) may adopt technologies such as BCD (Bipolar-CMOS-DMOS) technology.

BCD technology may be advantageously used, e.g., to produce integrated circuits ICs with both power electronics and logical control electronics. BCD technology provides a family of silicon processes, each of which combines the strengths of three different process technologies onto a single chip: bipolar for precise analog functions, CMOS (Complementary Metal Oxide Semiconductor) for digital design and DMOS (Double Diffused Metal Oxide Semiconductor) for power and high-voltage elements.

Implementing BCD technology may involve top layer copper metal interconnections, called Re-Distribution Layer (RDL).

Resistance of passivation and intermediate insulating layers against reliability issues, as caused, e.g., by thermoelastic coupling and stresses during wire bonding and packaging processes, may represent factors deserving attention.

Silicon nitride (SiN) or silicon carbide (SiC) may be used in manufacturing ICs to provide a passivation layer for microchips, e.g., to provide a barrier against water molecules and other sources of corrosion and instability in microelectronics.

In structure corners of metallizations such as Cu (copper) RDL top metallizations, stresses may arise due to thermomechanical mismatch between different materials, e.g., barrier layer (TiW, Ta, TaN), metallization capping layer (Ni—Pd, Ni—Pd—Au, Ni—Au), passivation layer (SiN, SiC) triple point).

BRIEF SUMMARY

One or more embodiments contribute in overcoming the prior art problems mentioned in the foregoing, for instance passivation stress in the passivation layer upper surface at the edge (e.g., at a corner) of a Cu RDL structure.

According to one or more embodiments, a method manufactures a semiconductor device and includes:
  providing a passivation layer over a dielectric layer;
  providing a metallization on the passivation layer, the metallization having a corner; and
  providing a via through said passivation layer and said dielectric layer near said corner.

One or more embodiments may also relate to a corresponding semiconductor device.

The claims are an integral part of the technical disclosure of one or more embodiments has provided herein.

One or more embodiments may involve, e.g., the insertion of dummy vias (namely vias without electrical connection to an active device), such as re-distribution layer (RDL) vias, landing on an underlying metal layer (Metal n−1) as close as possible to a RDL corner. A similar embodiment may involve electrical functionally vias designed to obtain the same RDL corner proximity as dummy vias.

One or more embodiments may decrease, e.g., triple point stress.

One or more embodiments may increase passivation robustness by acting only on layout rules, without process modification, that is without impact on the final user.

BRIEF DESCRIPTION OF THE SEVERAL VIEWS OF THE FIGURES

One or more embodiments will now be described, merely by way of example, with reference to the annexed figures, in which.

It will be appreciated that, for the sake of clarity of illustration, the figures may not be drawn to same scale.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Semiconductor device metallizations such as, e.g., Cu structures with a Ni—Pd, Ni—Pd—Au, Ni—Au and/or capping layer Ni-based, possibly involving a Cu activation process prior to electroless deposition represent an extensive area of technical investigation.

Exemplary of related activity are, e.g.:
  P. K. Yee, et al.: "Palladium-Copper Inter-diffusion during Copper Activation for Electroless Nickel Plating Process on Copper Power Metal", 2014 IEEE 21st International Symposium on the Physical and Failure Analysis of Integrated Circuits (IPFA),
  U.S. Pat. No. 6,093,631 B1, or
  U.S. Pat. No. 6,413,863 B1.

Figure 1:
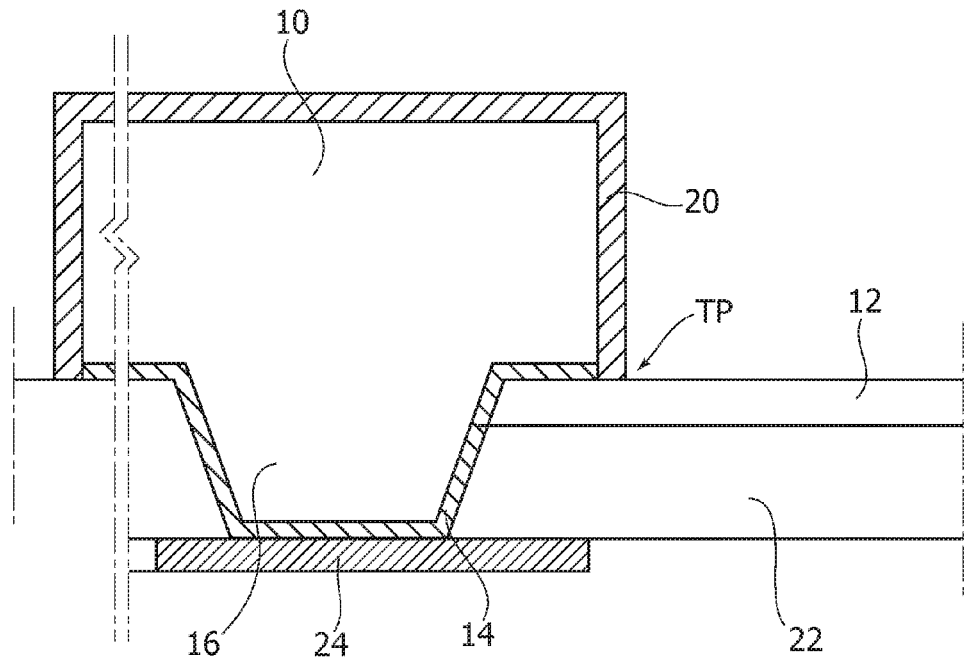
FIG. 1 is a vertical cross-sectional view of a metallization to which one or more embodiments may apply.

FIG. 1 is exemplary of a possible arrangement of a metallization 10 in a semiconductor device such as, e.g., a Cu wire bonding pad provided on a substrate such as a substrate with a passivation layer (e.g., SiN, SiC) 12 over a dielectric layer 22, with a layer 14 (e.g., TiW, Ta, TaN) acting as a barrier under the metallization 10, e.g., a Cu-RDL (re-distribution layer) structure.

Figure 2:
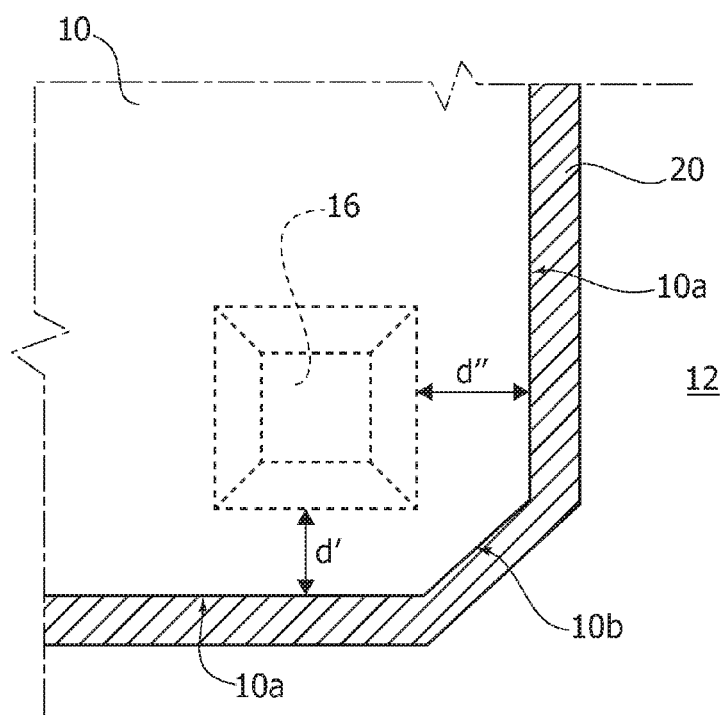
FIG. 2 is a plan view of a portion of a metallization as exemplified in FIG. 1 according to one or more embodiments.

In one or more embodiments, a metallization (Cu-RDL structure) 10 as exemplified in FIG. 2 may exhibit two sides 10a converging towards a corner 10b. In one or more embodiments, the corner 10b may include an, e.g., at least slightly beveled vertex (or corner proper).

It was observed that stresses such as passivation stress may arise in the SiN or SiC upper surface at the edge (foot) of, e.g., Cu-RDL structure with a higher value at the Cu_RDL corner 10b, e.g., at a triple point TP (see FIG. 1) where the barrier layer 14 underlying the Cu-RDL structure 10 is in contact with a (e.g., Ni-based) capping layer 20 provided on the metallization 10.

In one or more embodiments at least one via 16 (that is a through hole in the passivation layer 12 and the dielectric layer 22) may be provided under the metallization 10 landing on an underlying metal layer 24.

In one or more embodiments, the via 16 may include a "dummy" via, namely a via without electrical connection to any active device.

In one or more embodiments as exemplified in FIG. 1, the metallization 10 may extend into the via 16.

In one or more embodiments as exemplified in FIG. 1, the barrier layer 14 (e.g., TiW, Ta, TaN) acting as a barrier under the metallization 10 may form a lining layer that lines the via 16.

In one or more embodiments, the via 16 may be a, e.g., re-distribution layer (RDL) via landing on what is currently referred to as Metal n−1 (underlying metal layer 24).

In one or more embodiments, the via 16 may be arranged as close as possible to the corner 10b.

In one or more embodiments this may involve providing the via 16, which may be provided by any known means for that purpose, at a distance d', d" between approximately 1 micron ($10^{-6}$ m) and approximately 10 micron ($10^{-5}$ m) from each of the converging sides 10a which jointly define the corner portion 10b of the metallization 10.

In one or more embodiments such a measure was found to improve passivation robustness by operating only on the layout rules of the metallization without any process modification, that is without appreciable impact on final product performance.

Experiments performed with the applicant company have demonstrated that such a placement of vias 16 exhibit correlation with passivation fails occurrence, with the number of the fails reduced (and notionally made nil) at those locations where vias 16 are provided.

Consequently, it may be concluded the presence of vias may effectively decrease passivation layer stress.

Without prejudice to the underlying principles, the details and embodiments may vary, even significantly, with respect to what has been disclosed merely by way of example, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   manufacturing a semiconductor device, the manufacturing including:
   providing a passivation layer over a dielectric layer, the passivation layer being formed from SiC or silicon carbide (SiC) or silicon nitride (SiN);
   providing a metallization layer on the passivation layer, the metallization layer having a corner; and
   providing a via through said passivation layer and said dielectric layer near said corner, a portion of the metallization layer being in the via, wherein the portion of the metallization layer in the via is shaped as a frustum with a base and a tip, wherein thicknesses of the passivation layer and the dielectric layer are such that the tip is farther from a bottom surface of the passivation layer than the base.

2. The method of claim1, wherein providing said via includes providing the via without electrical connections to an active device.

3. The method of claim 1, wherein:
   said corner includes converging sides; and
   providing said via includes providing said via at a distance between approximately 1 micron and approximately 10 micron from each one of said converging sides.

4. The method of claim 1, wherein the metallization layer is a Cu (copper) metallization layer.

5. The method of claim 1, wherein providing said via includes providing the via as a via landing on an underlying metal layer in a substrate.

6. The method of claim 1, further comprising forming a barrier layer lining the via and underlying the metallization layer.

7. A semiconductor device, comprising:
   a dielectric layer;
   a passivation layer over the dielectric layer, the passivation layer being an SiC layer or an SiN layer;
   a metallization layer having a corner;
   a plurality of vias including a via through said passivation layer and said dielectric layer near said corner, a portion of the metallization layer being in the via having a frustum shape; and
   an underlying metal layer, the underlying metal layer having a plurality of landings underlying the dielectric layer, wherein each portion of the metallization layer in the plurality of vias includes a via landing on the respective landing of the underlying metal layer, wherein the metallization layer is a conductive layer configured to conduct current across the metallization layer, a first one of the plurality of landings being a dummy layer configured to restrict current across the underlying metal layer and a second one of the plurality of landings being an active layer configured to conduct current across the underlying metal layer.

8. The semiconductor device of claim 7, wherein said via is without electrical connections to an active device.

9. The semiconductor device of claim 7, wherein said corner includes converging sides, wherein said via is at a distance between approximately 1 micron and approximately 10 micron from each one of said converging sides.

10. The semiconductor device of claim 7, wherein said metallization layer includes a Cu metallization layer.

11. The semiconductor device of claim 7, further comprising a barrier layer lining the via and underlying the metallization layer.

12. A semiconductor device, comprising:
    a dielectric layer;
    a passivation layer over the dielectric layer, the passivation layer including at least one of SiN and SiC;
    a metallization layer on the passivation layer, the metallization layer having a corner;

a via through said passivation layer and said dielectric layer near said corner, wherein the metallization layer extends into the via;

a barrier layer lining the via and extending between the metallization layer and the passivation layer; and a capping layer over the metallization layer, the capping layer abutting the barrier layer at the corner of the metallization layer.

13. The semiconductor device of claim 12, wherein said via is without electrical connections to an active device.

14. The semiconductor device of claim 12, wherein said corner includes converging sides, wherein said via is at a distance between approximately 1 micron and approximately 10 micron from each one of said converging sides.

15. The semiconductor device of claim 12, wherein said metallization layer includes a Cu metallization layer.

16. The semiconductor device of claim 12, further comprising:

a substrate having a first planar surface, the dielectric layer on the first planar surface of the substrate; and an underlying metal layer in the substrate and having a second planar surface coplanar with the first planar surface, the underlying metal layer underlying the dielectric layer, wherein said via includes a via landing on the underlying metal layer.

* * * * *

UNITED STATES PATENT AND TRADEMARK OFFICE
CERTIFICATE OF CORRECTION

PATENT NO. : 9,960,131 B2  
APPLICATION NO. : 15/251355  
DATED : May 1, 2018  
INVENTOR(S) : Colpani et al.

Page 1 of 1

It is certified that error appears in the above-identified patent and that said Letters Patent is hereby corrected as shown below:

On the Title Page

Item (*) Notice:
"0 days. days." should read --0 days--.

In the Claims

Column 3, Line 66, Claim 1:
"from SiC or silicon" should read --from silicon--.

Signed and Sealed this
Seventeenth Day of November, 2020

Andrei Iancu
*Director of the United States Patent and Trademark Office*